United States Patent [19]

Shaw

[11] Patent Number: 5,428,565
[45] Date of Patent: Jun. 27, 1995

[54] SINGLE STAGE SENSING APPARATUS FOR A CONTENT ADDRESSABLE MEMORY

[75] Inventor: Jeng-Jye Shaw, Palo Alto, Calif.

[73] Assignee: Intel Corporation, Santa Clara, Calif.

[21] Appl. No.: 212,350

[22] Filed: Mar. 11, 1994

[51] Int. Cl.⁶ ............................................. G11C 13/00
[52] U.S. Cl. .................... 365/49; 365/189.04; 365/189.07
[58] Field of Search ............... 365/49, 189.04, 189.07, 365/190, 154, 156, 230.03, 230.01

[56] References Cited

U.S. PATENT DOCUMENTS

| | | | |
|---|---|---|---|
| 5,014,195 | 5/1991 | Farrell | 365/49 X |
| 5,067,078 | 11/1991 | Talgam | 365/49 X |
| 5,226,009 | 7/1993 | Arimoto | 365/189.04 |
| 5,327,372 | 7/1994 | Oka | 365/49 |

Primary Examiner—Joseph A. Popek
Assistant Examiner—Son Mai
Attorney, Agent, or Firm—Blakely, Sokoloff, Taylor & Zafman

[57] ABSTRACT

An apparatus with improved response-time of a content addressable memory (CAM) directory table is obtained by replacing multi-stage domino TAG comparator and detection means with a single stage TAG comparator and detector for each TAG table entry. The improved response results from the use of a common ORed comparator output together with a small signal sense amplifier for the detection of the onset of a hit or miss. The single stage comparator and detector is suitable for use in cache memories including full associative, direct mapped, set associative and sector mapped caches.

11 Claims, 13 Drawing Sheets

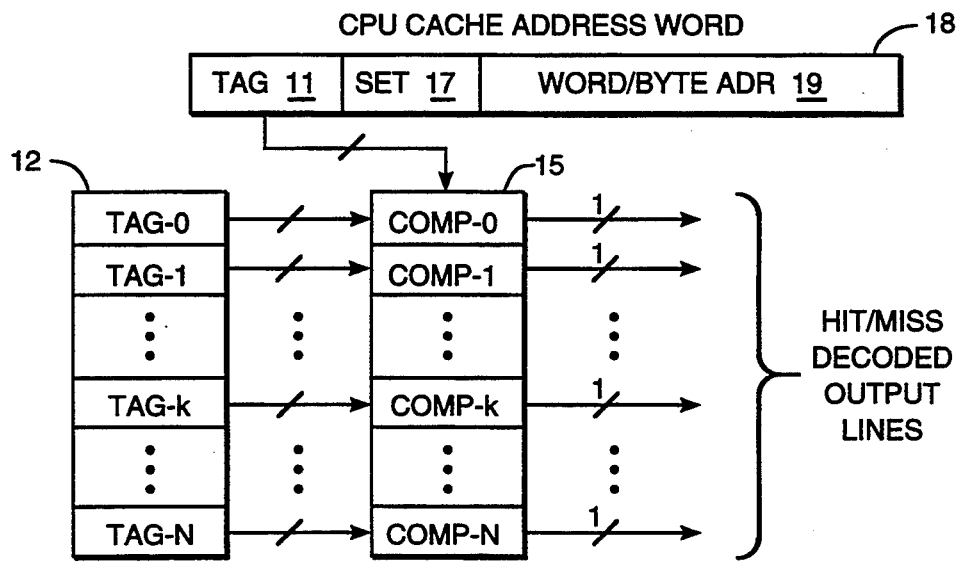
FIG_1A
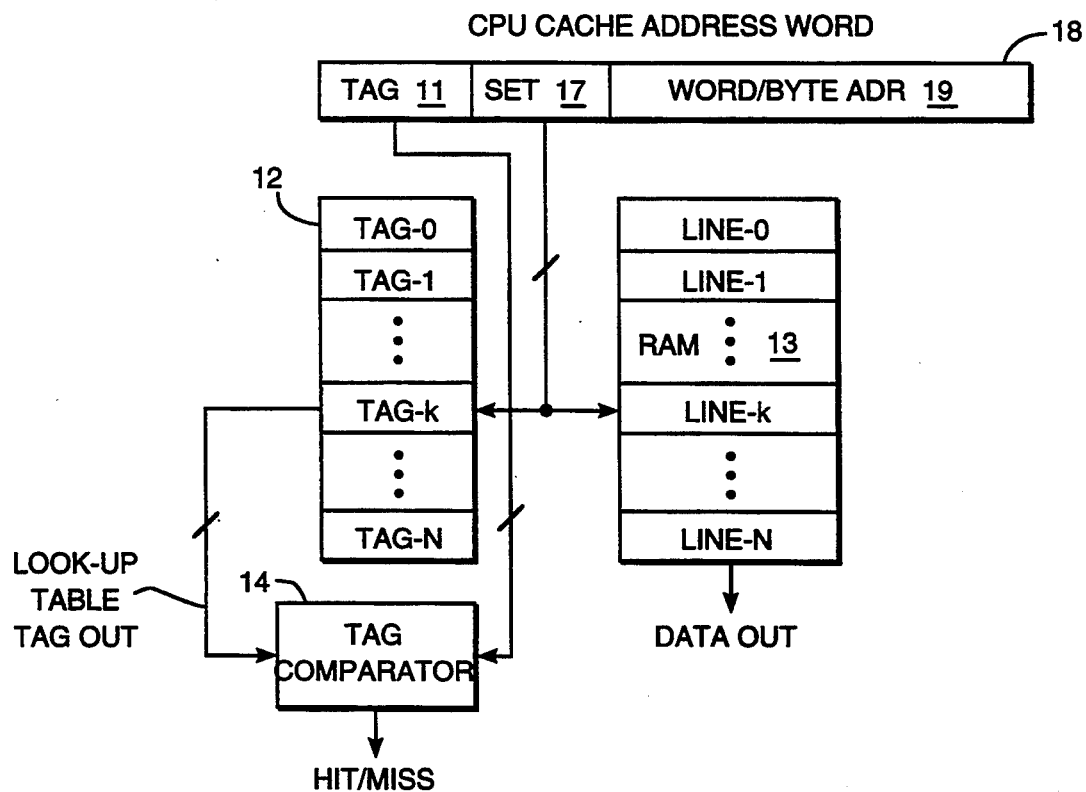
FIG_1B

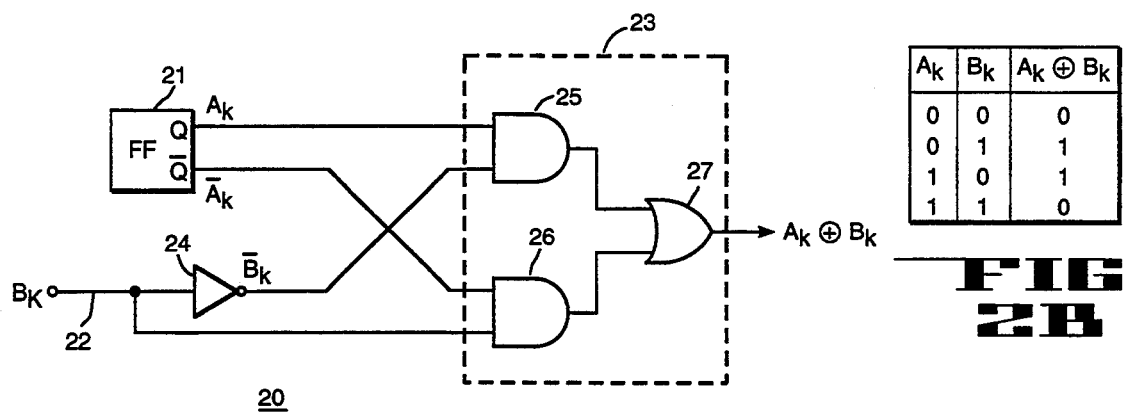
FIG_2A    FIG 2B
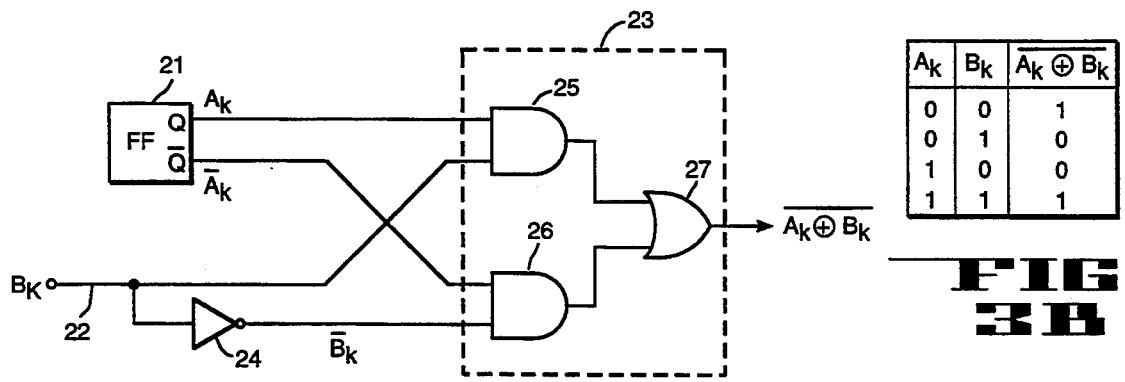
FIG_3A    FIG 3B

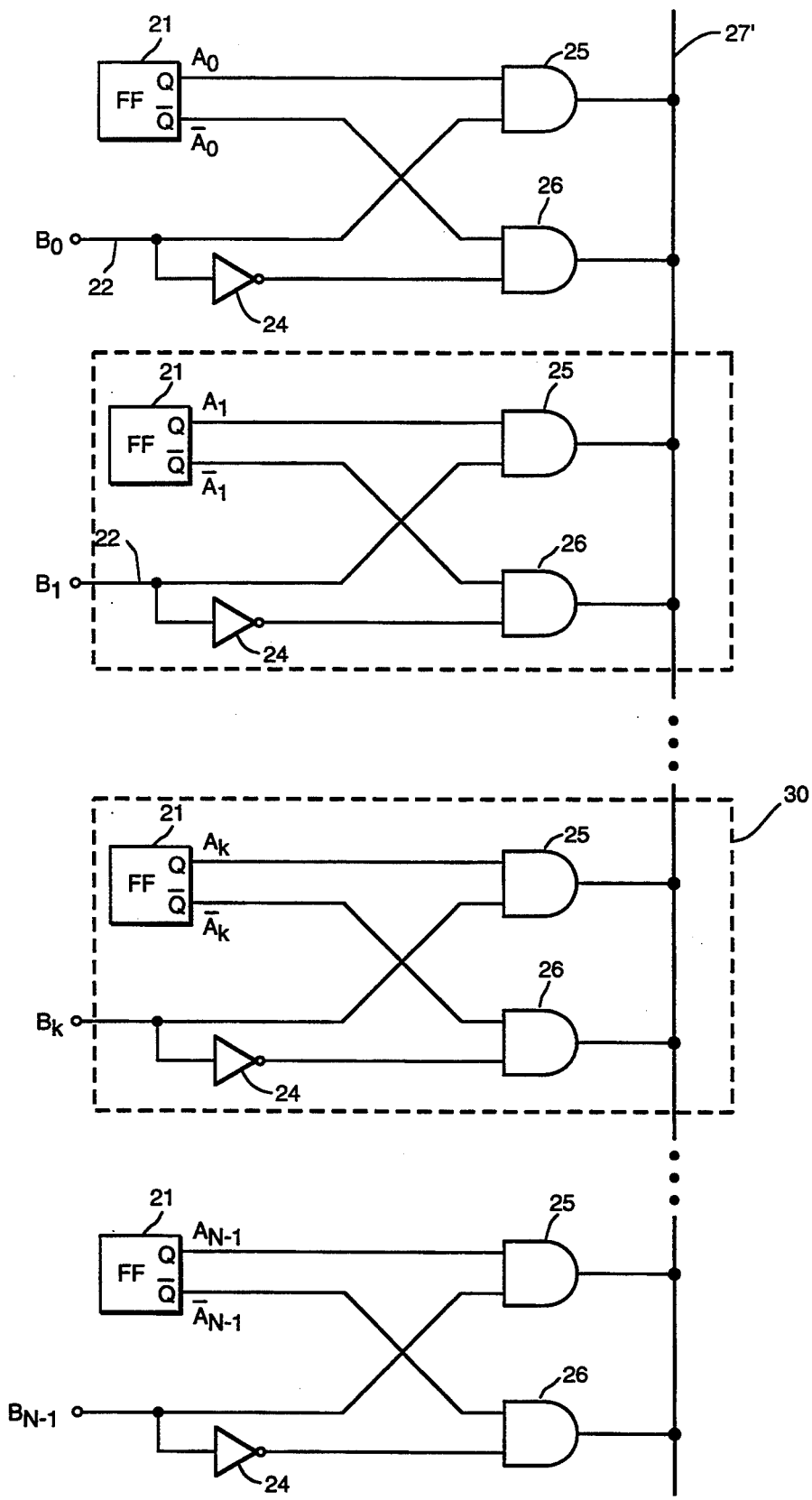
FIG_4

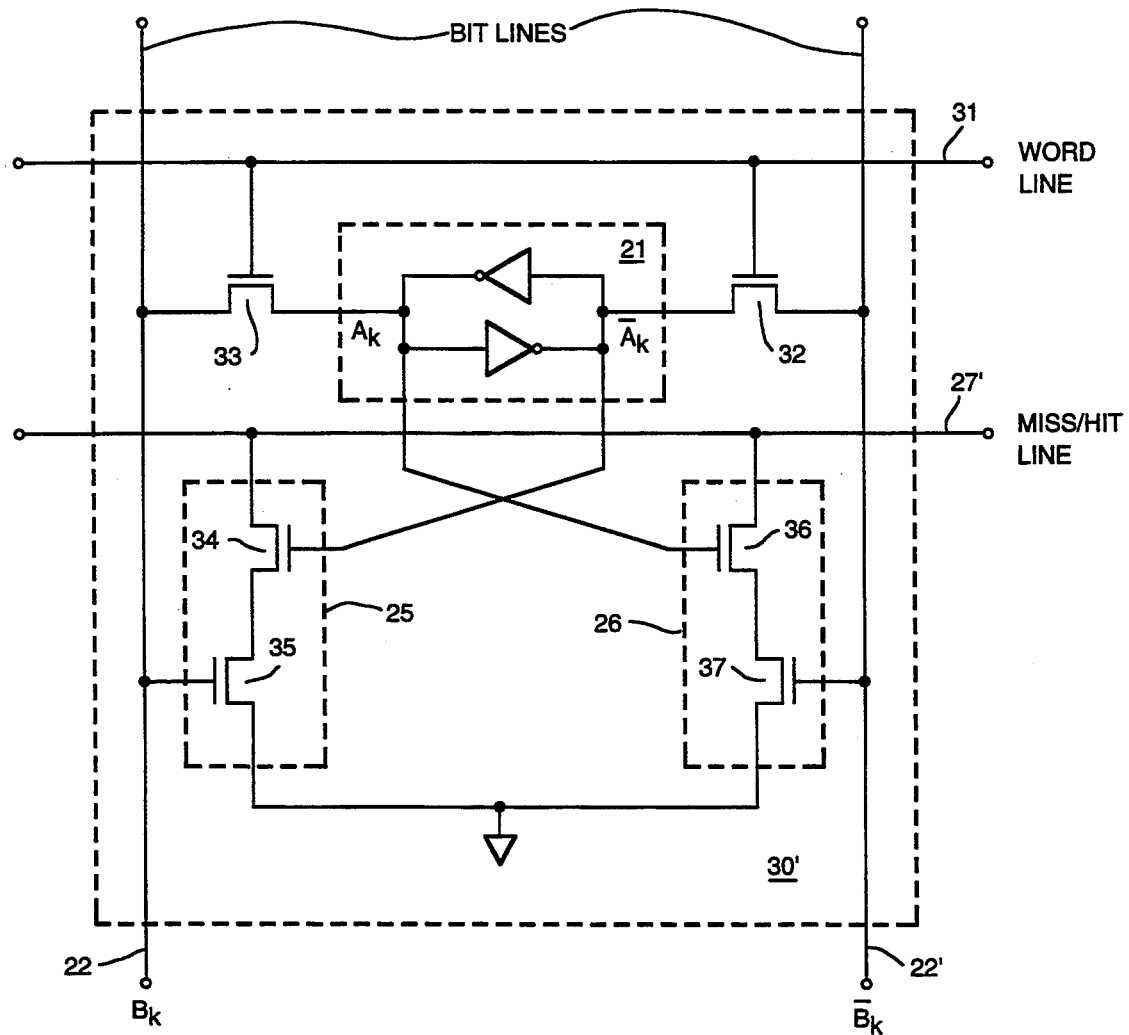
FIG_5

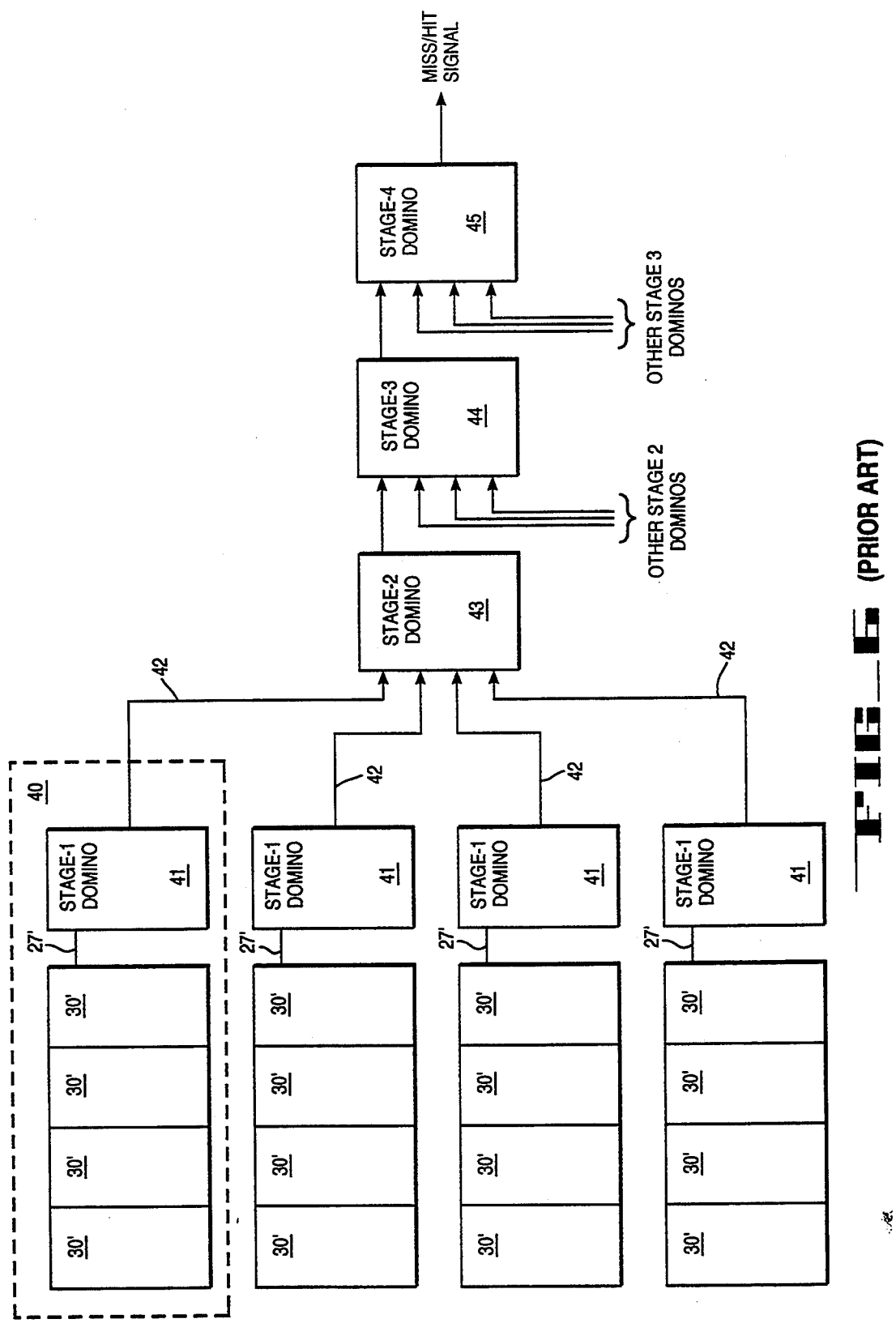
FIG_5 (PRIOR ART)

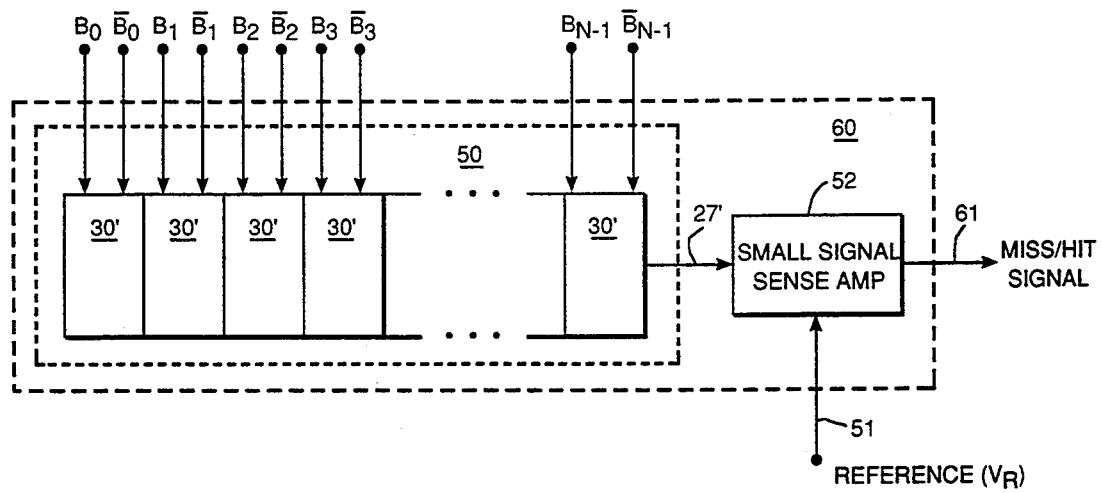
FIG_7
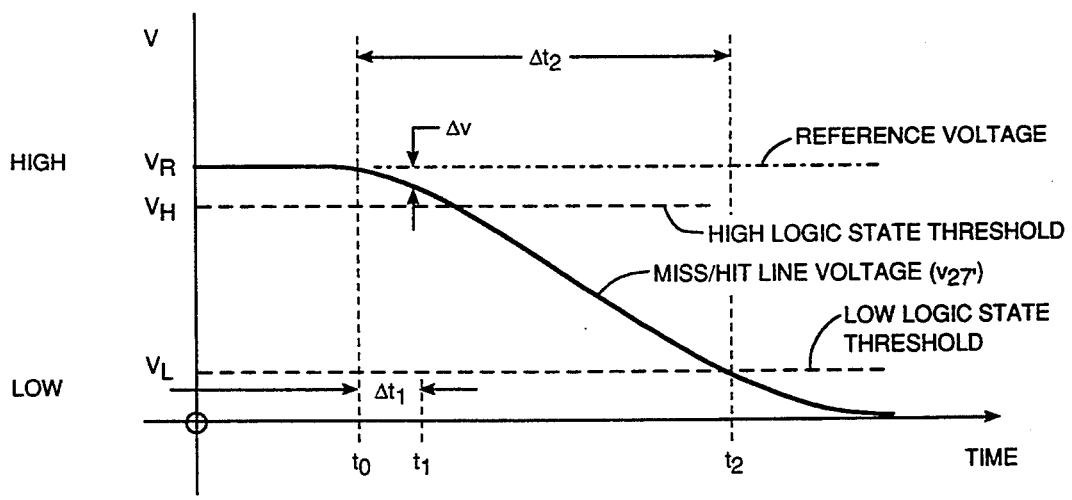
FIG_8

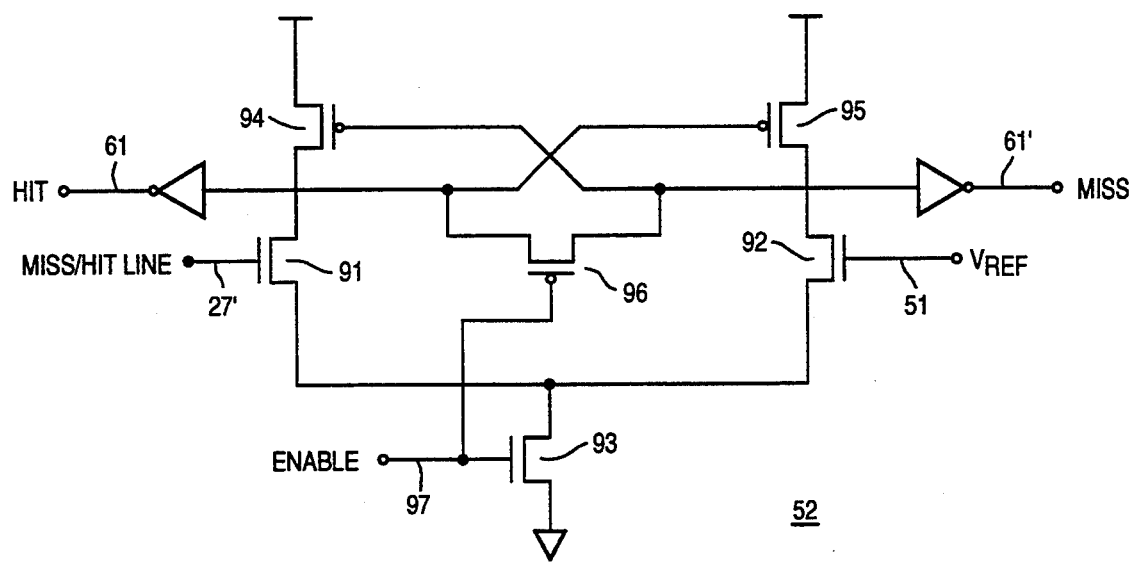
FIG_10A (PRIOR ART)
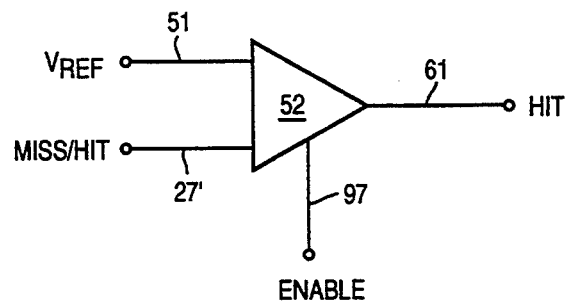
FIG_10B (PRIOR ART)

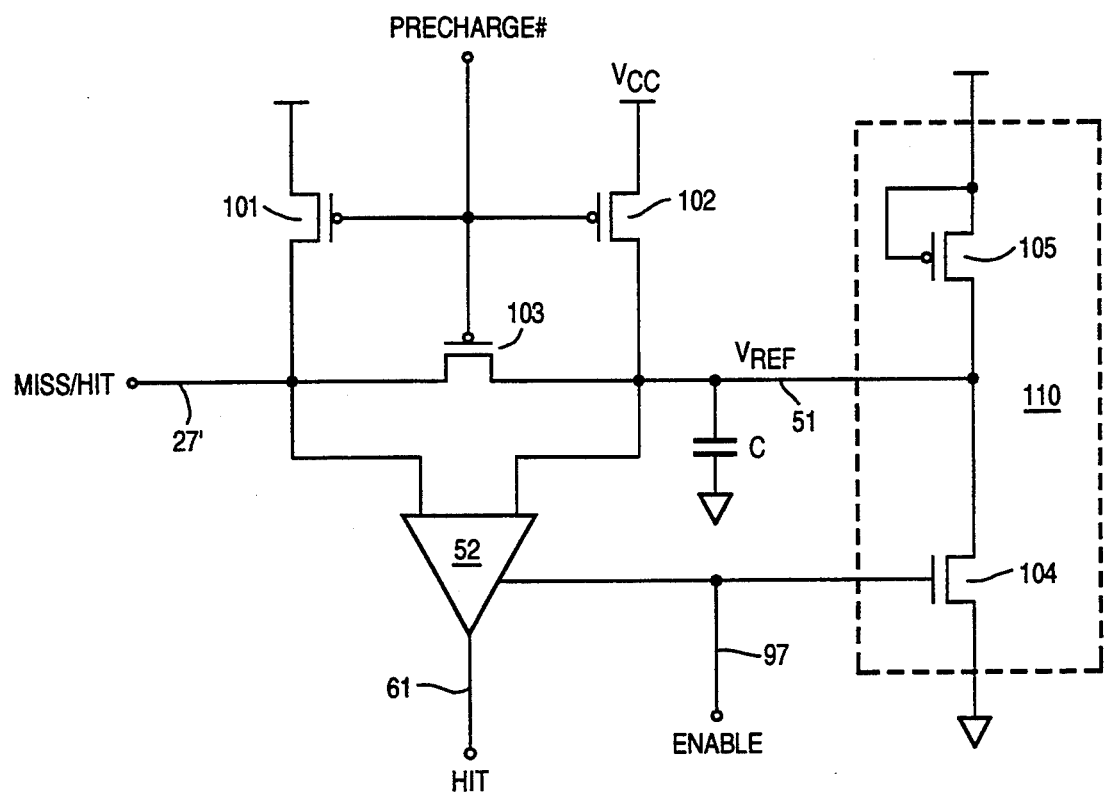
FIG_11A
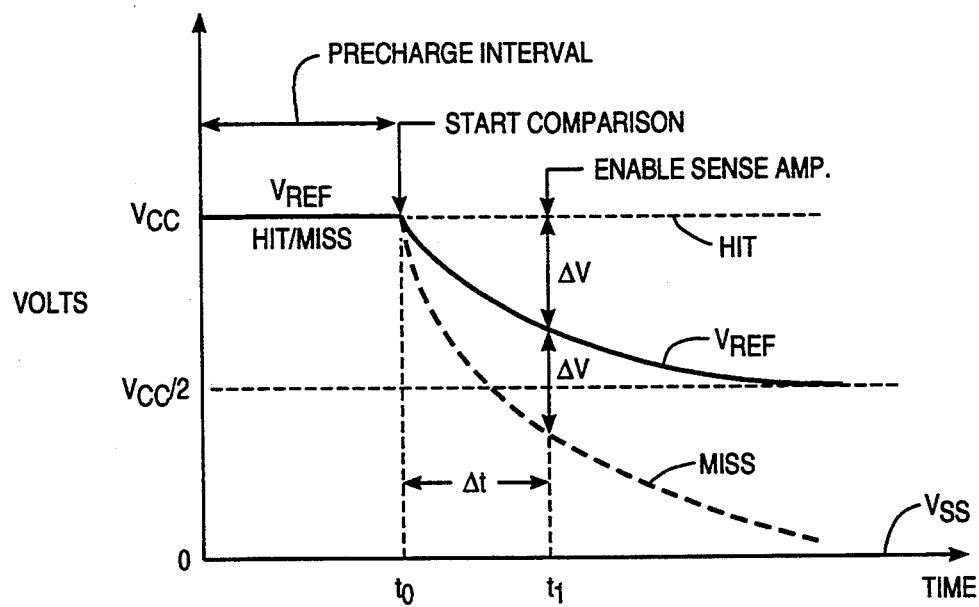
FIG_11B

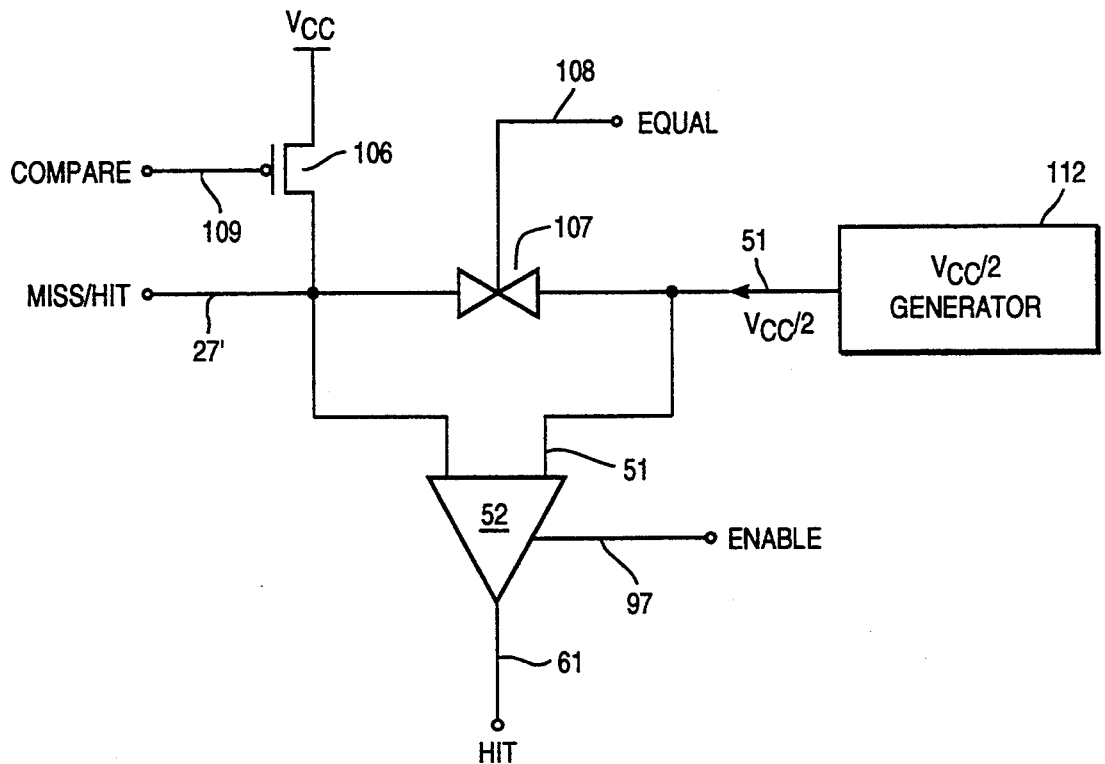
FIG_12A
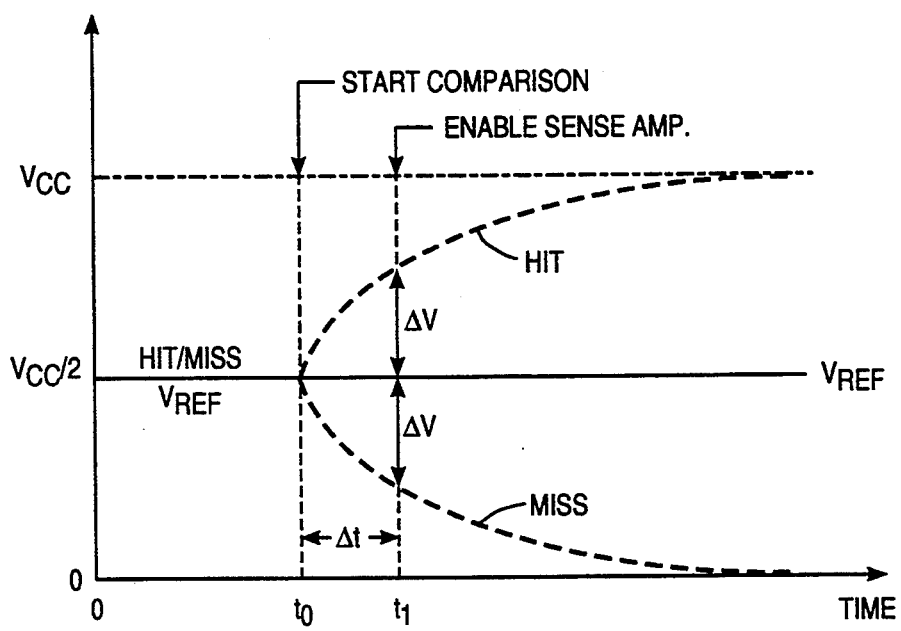
FIG_12B

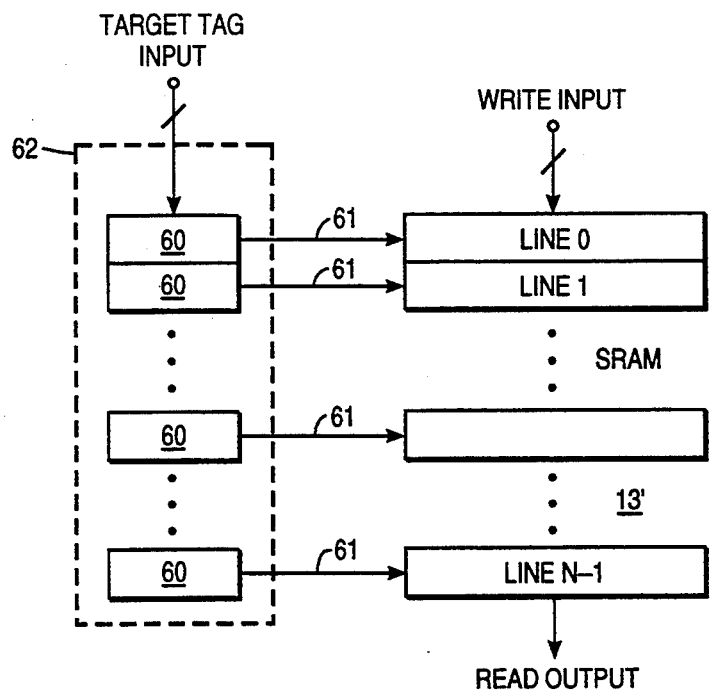
FIG_13
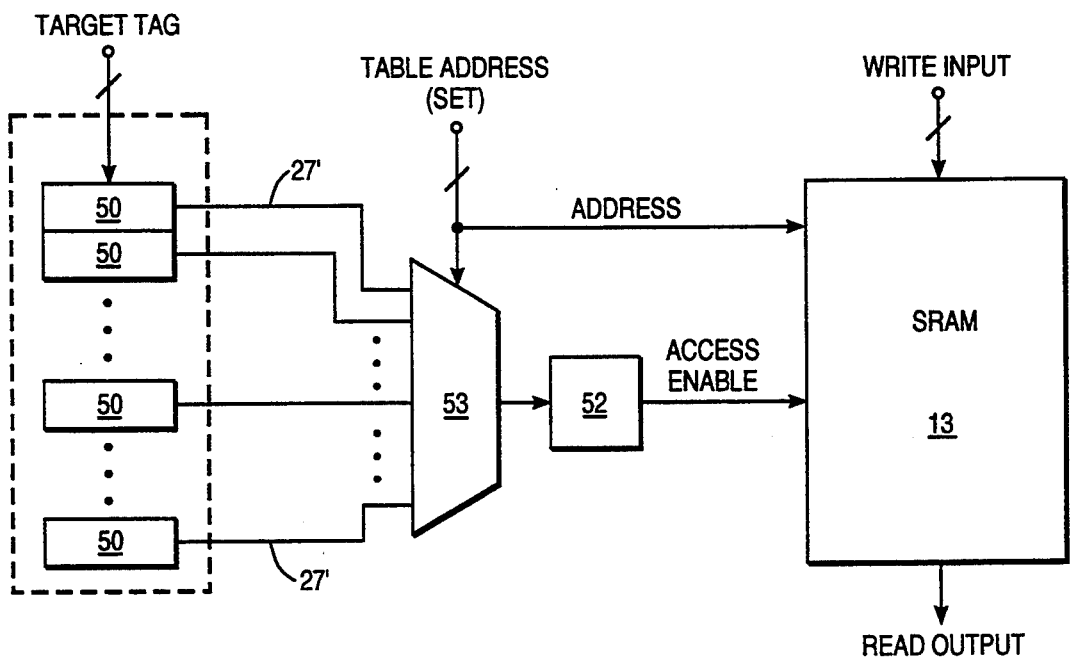
FIG_14

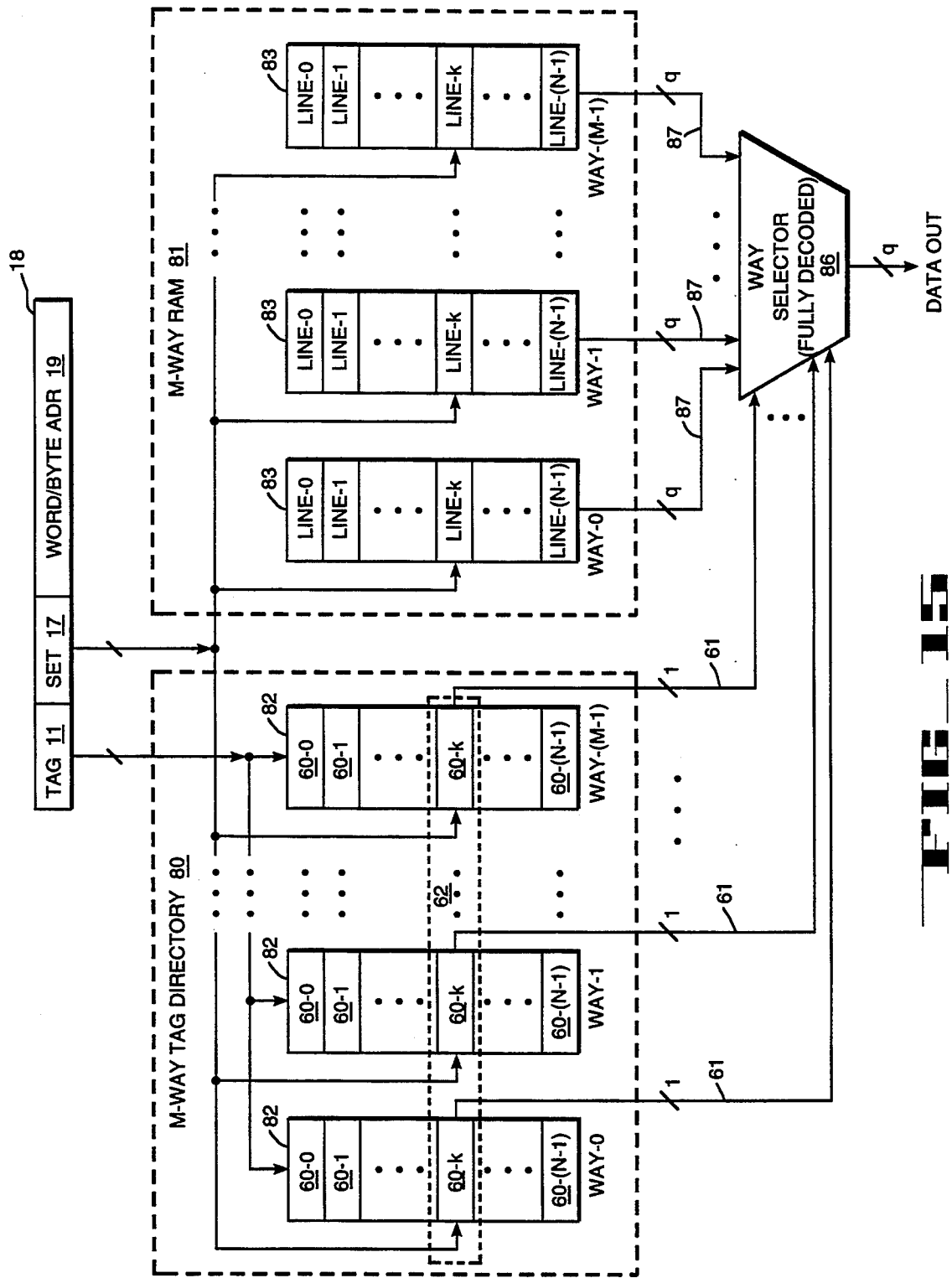
FIG_15

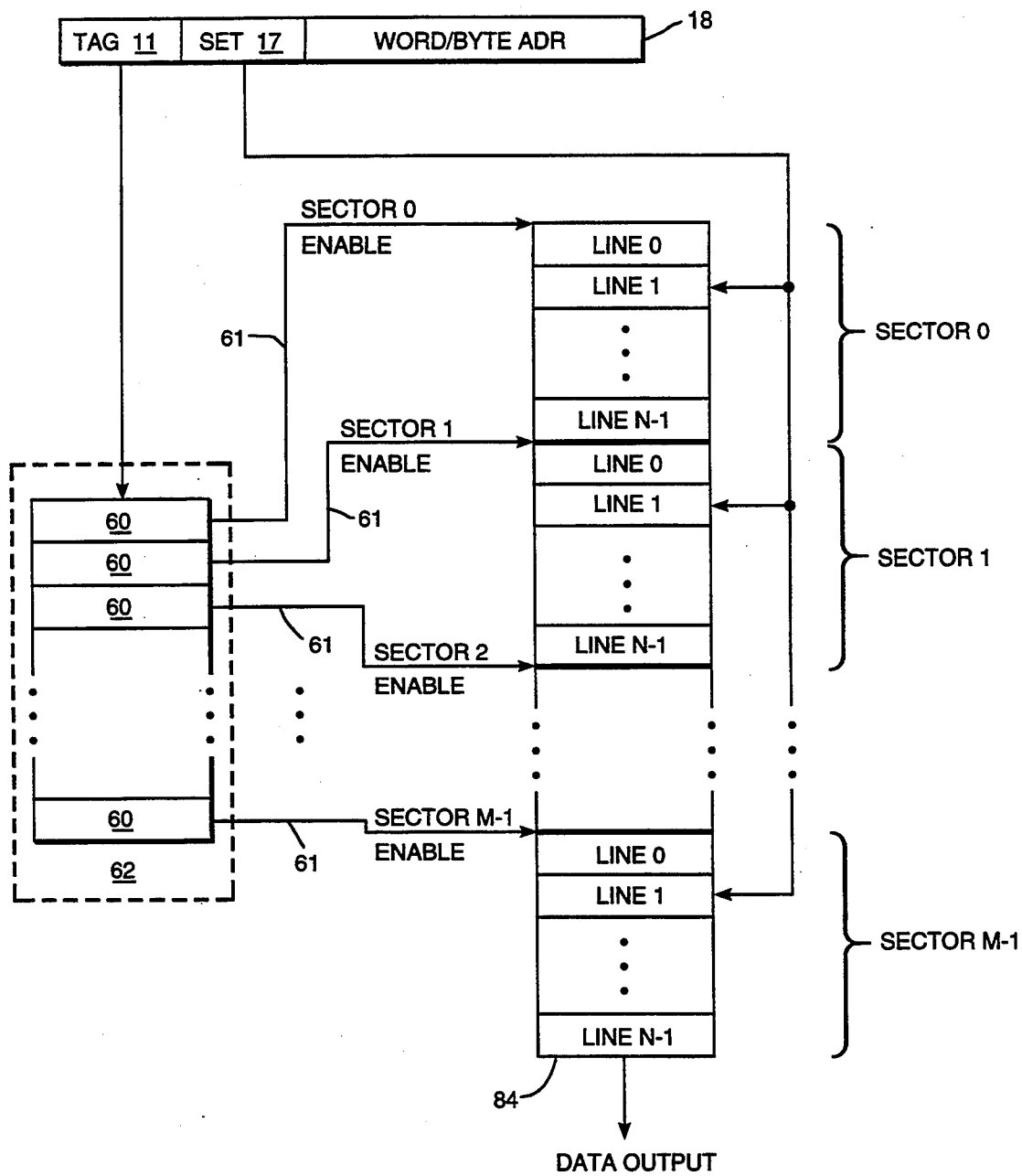
FIG_16

SINGLE STAGE SENSING APPARATUS FOR A CONTENT ADDRESSABLE MEMORY

FIELD OF THE INVENTION

The present invention relates to an apparatus for determining a hit or miss when operating a lookup table of a content addressable or associative memory.

BACKGROUND OF THE INVENTION

As the processing speed of microprocessors (CPUs) increases associated apparatus such as memories must keep pace in order to avoid being performance bottlenecks in the microprocessor system. The present invention is directed to improving the effective bandwidth of content addressable or associative memories by improving the ability to detect and access a specific piece of data in a content addressable memory (CAM). One important class of CAMs, known as a cache memory, is a fast memory in the hierarchical memory structure that is most closely associated with the CPU. However, the present invention is directed to all CAM structures in diverse applications including use in associative processors. A common characteristic of all CAMs is that data is retrieved from memory locations based on their content. The CAM searches in parallel over all or part of its entire storage using a target content description and comparing it with a corresponding field of bits in each memory location.

Because of the importance of cache memories, most of the following description is couched in terms of cache memories, however, it will be recognized by those practicing the underlying art that the inventive principles expounded are more broadly applicable.

High performance, modern microprocessors (CPUs) typically include an on-chip cache memory in order to minimize instruction latencies. Cache memories are effective because of the temporal locality phenomenon of typical instructions that tends to reuse portions of code so that access to memory tends to slowly drift with the progress of the instruction program. Consequently, portions of memory currently being addressed are likely to be accessed again in the near term so that if a fast local memory (cache) is provided, on-chip repeated access to slower, off-chip main memory can be reduced. As the temporal locality shifts, new data from main memory is acquired by the on-chip cache.

Critical to the efficient operation of the cache memory is the speedy determination of whether the current information required by the CPU is resident in cache: if present (a cache "hit") access can then be made to cache, and if not (a cache "miss") access must be made to the slower main memory.

Main memory consists of a large set of lines with consecutive addresses. Cache memory holds many lines (e.g. the Intel i486 TM microprocessor cache memory is physically split into four 2-K blocks, each with 128 lines and 128 21-bit tags) but not necessarily in any particular order. When the CPU requires access to memory, the CPU first searches the cache to see if the desired data is present. Typically, the search is an associative process in which each line stored in cache has an address tag that indicates which lines of main memory are resident in cache. A comparison is made between the CPU provided tag and the tags associated with lines stored in cache. A match between the two indicates a "hit" while the lack of a match indicates a "miss", requiring an access to main memory. The data line acquired from main memory is stored in cache by replacing a previously stored line based on a prescribed replacement policy such as replacing the least recently used (LRU) line.

Because of the need to perform a tag comparison each time that the cache is accessed, the speed with which the comparison can be done is critical in determining the effective bandwidth of the cache memory.

The word TAG is used hereafter to mean a field of bits representative of the content addressable portion of a line of data stored in CAM.

A line of data is used to mean a standard unit of data storage which may include one or more bytes or words.

SUMMARY OF THE INVENTION

According to the present invention, a single stage sensing apparatus for sensing of a hit or miss comparison is provided in order to increase the speed of comparison of a CPU provided TAG with the CAM TAGs.

One object is to provide a fast single stage TAG comparator and sensing apparatus for use in CAMs by means of a small signal sensing amplifier to predict the onset of a comparator output change from a first state to a second state by comparing the single stage comparator output with a reference voltage representative of the first state and amplifying the difference voltage.

Another object is to provide a fully associative CAM that uses single stage sensing.

Another object is to provide a direct mapped CAM that uses single stage sensing.

Another object is to provide a set associative CAM that uses single stage sensing.

Another object is to provide a sector mapped CAM that uses single stage sensing.

BRIEF DESCRIPTION OF THE DRAWINGS

The present invention may be understood more fully from the detailed description given below and from the accompanying drawings of the preferred embodiments of the invention which, however, should not be taken to limit the invention to the specific embodiment but are for explanation and understanding only.

FIGS. 1(a) and 1(b) show two basic cache memory look-up table configurations.

FIGS. 2(a) and 2(b) show a one-bit TAG look-up table storage and comparator network, and the corresponding truth table.

FIGS. 3(a) and 3(b) show another one-bit TAG look-up table storage and comparator network and the corresponding truth table.

FIG. 4 shows a wired-OR multi-bit TAG storage and comparator network.

FIG. 5 shows circuit details of a one-bit TAG storage and comparator network.

FIG. 6 shows a prior art multi-stage multi-bit TAG look-up table storage and comparator network.

FIG. 7 shows a single-stage multi-bit TAG look-up table storage and comparator network for use with a single TAG table entry.

FIG. 8 is a graphical representation of the miss/hit detection method used in the single stage comparator.

FIGS. 10(a) and 10(b) show a small signal sense amplifier circuit and the corresponding symbolic schematic.

FIGS. 11(a) and 11(b) show a schematic for precharging the detection circuit to $V_{CC}$ and the associated HIT/MISS waveform.

FIGS. 12(a) and 12(b) show a schematic for precharging the detection circuit to $V_{CC}/2$ and the associated HIT/MISS waveform.

FIG. 13 is a block diagram of a fully associative CAM using a single stage sensing directory with fully decoded SRAM line control.

FIG. 14 is a block diagram of a direct mapped CAM using a multiplexed single stage sensing directory.

FIG. 15 is a set associative CAM with a TAG directory using single stage sensing techniques.

FIG. 16 is an M-sector mapped CAM with a single stage sensing directory.

DESCRIPTION OF THE PREFERRED EMBODIMENT(S)

Figure 9:
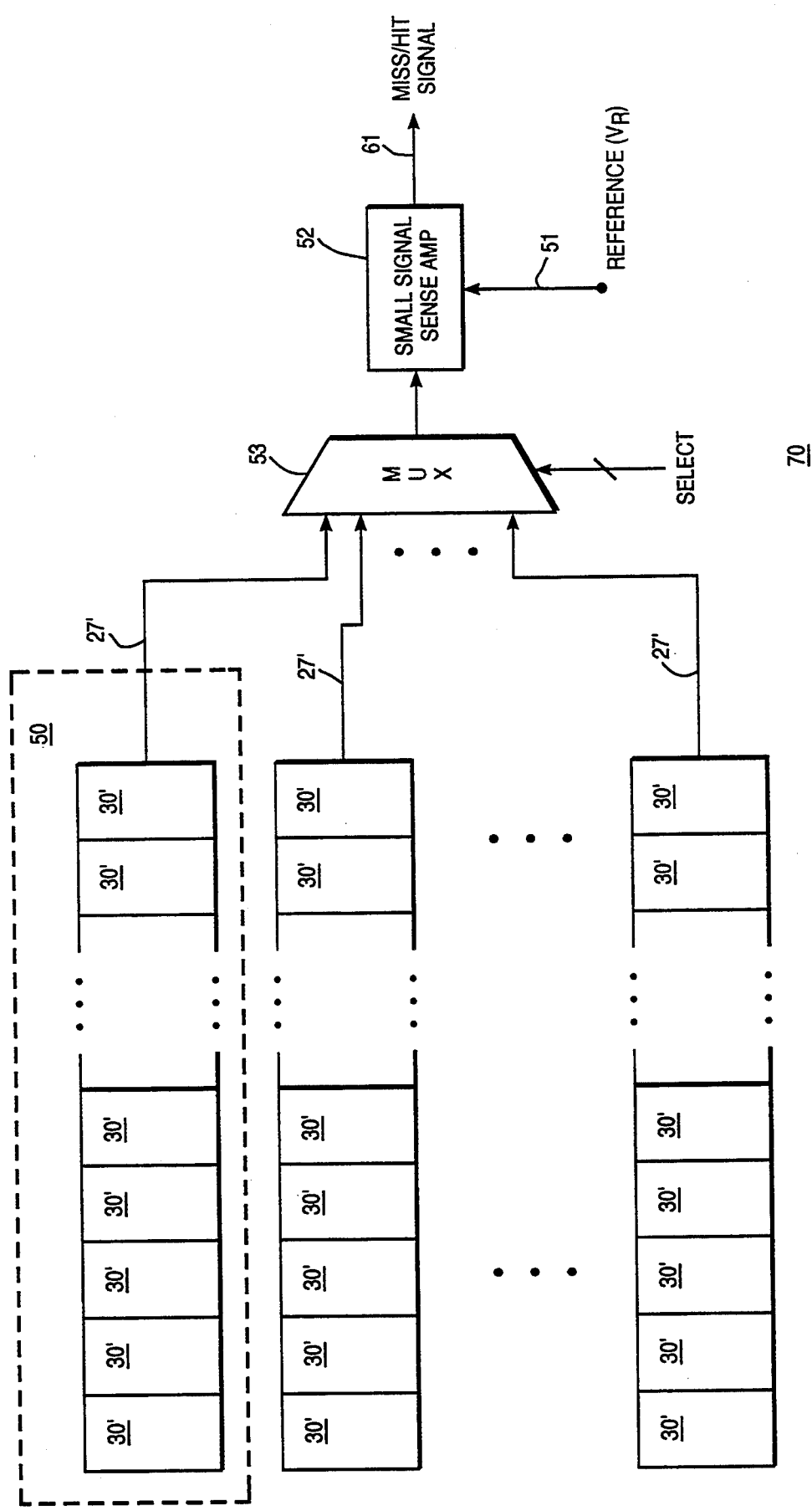
FIG. 9 is a block diagram of a complete TAG look-up table for a direct mapped cache using single stage detection and multiplexed small signal sense amplifier.

A single stage sensing apparatus for a look-up table associated with a cache memory is described. The preferred embodiment is shown using specific hardware circuitry as well as block diagrams representing circuitry that is well known in the art in order to more clearly convey the essence of the invention by avoiding unnecessary details. It should be recognized, however, that the specific implementation shown is by way of example and as such does not imply any limitation on the spirit and scope of the invention.

Content addressable memories (CAMs), also known as associative memories are random access memories (RAMs) that, in addition to having a conventional addressing means also have logic means for simultaneously comparing a set of bits for all stored lines of data in memory during a single memory cycle. This allows accessing of data without the use of a location address because a portion of the line contents may be used to identify and access the desired line. The most popular form of CAMs are the cache memories.

Cache memories are part of a hierarchical memory organization wherein the cache is the smaller and faster memory placed in close association with the central processing unit (CPU) while slower main memory used for bulk storage is more removed. The basic unit of information that moves between main memory and cache is called a "line". Therefore, main memory consists of a large set of lines with consecutive addresses.

Cache memory contains a subset of lines, each line being a copy of a main memory line but not necessarily stored in any particular order. Search of cache is usually "associative". That is, each line or set of lines has an associated address "TAG" that indicates which lines of main memory these lines represent. The lines are usually compared simultaneously with the CPU provided line address TAG. A match indicates a "hit". A non-hit or "miss" indicates that main memory must be accessed because the required data is not resident in cache. The CPU supplied address goes through an address map to strip-out the TAG and to determine which line or set of lines are to be searched. Cache memories are also known as content addressable memories (CAMs).

Cache memories may be classified according to the type of memory mapping used, as follows:

(1) a fully associative cache may have any line in main memory stored in any cache line and uses one TAG comparator per line providing a fully decoded cache memory set of line select lines;

(2) a direct mapped cache is arranged so that each cache line contains one line of a specific main memory subset of non-overlapping subsets in which a line is identified by a SET field designating the main memory subset and a TAG field designating the particular line within the subset;

(3) a set associative cache is a combination of fully associative and direct mapped organizations in which disjoint sets of lines are directly mapped to a line using a SET field to identify the line address and a fully associative search is done over the set of lines using a TAG field; and (4) a sector mapped cache uses a TAG field to identify a particular set of contiguous addresses (a sector) of main memory while a SET field is used to designate a line within the sector.

FIGS. 1(a) and 1(b) show two examples of cache look-up table implementations that may be used. FIG. 1(a) shows a look-up table configuration for a cache directory that may be used for either a fully associative cache, the fully associative portion of a set associative cache, or for the associative look-up of a sector in a sector mapped cache. It is a fast method because all lines are compared in parallel.

The accessing CPU supplies a cache address word 18 in which the high order bit field TAG 11 contains the TAG information while the lower order field 19 contains address data specifying word and/or byte locations. TAG table 12 contains N TAG entries which are compared with TAG field 11 in the set of N comparators 15, with one comparator per TAG entry. The output of comparator set 15 is a set of N binary lines with one state representing a hit between the corresponding TAG entry of table 12 and TAG field 11, and the other state indicating a miss.

In the case of a fully associative cache having N lines of data, the N output lines of comparator set 15 constitute a fully decoded set of memory addressing lines that access the cache memory line corresponding to a hit.

In the case of a set associative cache, the structure shown in FIG. 1(a) may be used to implement the fully associative portion of the cache directory in which TAG field 11 identifies the particular set of a line selected by SET field 17 of CPU cache address 18. Speed of access is enhanced by the parallel comparisons in comparison set 15 and the fully decoded hit/miss output lines.

In the case of a sector mapped cache, the structure of FIG. 1(a) may be used as a means for selecting a particular sector from the set of sectors resident in cache using the fully decoded set of output lines from comparator set 15 while the SET field 17 is used to select a particular line of the sector selected by a hit-active output line of comparator set 15.

FIG. 1(b) shows a direct mapped cache memory in which SET field 17 of CPU cache address word 18 is used to identify a line index corresponding to a specific main memory subset and TAG field 11 designates the line index within the specified main memory subset. In this case, a single TAG comparator 14 is used to determine if the TAG specified line is resident at the location specified by SET field 17. If it is, a hit results at the output of comparator 14 and data is read out of the line in random access memory (RAM) 13 corresponding to line index specified by SET field 17.

A key element of the CAMs is the comparator. The speed and efficiency of the comparator, other than the RAM cycle time, controls the effective bandwidth of the CAM.

A simple one bit content addressable memory (CAM) storage and comparator cell is shown in FIG. 2(a). Flip-flop (FF) 21 represents a single bit storage cell for storing a TAG bit ($A_k$) of a TAG directory entry which is compared with a corresponding bit ($B_k$) of target TAG field 11 presented on line 22 and inverter 24 forms the logical compliment, $\bar{B}_k$. Logic circuit 23 forms the exclusive-OR (EXOR) of the bits as follows:

$$EXOR(A_k, B_k) = A_k \oplus B_k = \bar{A}_k \cdot B_k + A_k \cdot \bar{B}_k$$

where (+) indicates a Boolean OR operation and (·) indicates a Boolean AND operation. The truth table for EXOR($A_k, B_k$) shown in FIG. 2(b) indicates that the output state of logic circuit 23 is high if $A_k \neq B_k$, corresponding to a MISS. A MISS for any bit pair of the TAG is a miss for the entire TAG comparison. Hence it is sufficient to logically OR all one-bit CAM comparator outputs (one for each TAG bit) to determine if the comparison is a HIT or MISS. Alternatively, the complement of EXOR may be used to combine the one-bit comparisons of the directory TAG bits, {$A_k$}, with the target TAG bits, {$B_k$}.

The exclusive-NOR (EXNOR) operation may be expressed as $$EXNOR(A_k, B_k) = \overline{A_k \oplus B_k} = A_k \cdot B_k + \bar{A}_k \cdot \bar{B}_k$$

and its implementation is shown in FIG. 3(a) and the corresponding truth table is shown in FIG. 3(b). In this case, if $A_k \neq B_k$, the output is low.

FIG. 4 shows a wired-OR configuration for a multi-bit TAG directory TAG word storage and comparator network. A multiplicity of one-bit CAM comparator cells 30 are wired-OR connected to a common HIT/MISS line 27'. Each one-bit CAM comparator cell 30 contains a flip-flop 21 for storing one TAG bit, $A_k$, and an input line 22 for accepting the corresponding bit, $B_k$, from the cache address TAG field. AND-gates 25 and 26 form the Boolean terms $A_k \cdot \bar{B}_k$ and $\bar{A}_k \cdot B_k$, respectively. HIT/MISS line 27' performs to logical OR-ing to form the Boolean term ($A_k \cdot \bar{B}_k + \bar{A}_k \cdot B_k$) which corresponds to the EXNOR term $A_k \oplus B_k$. Thus, if the TAG field bits, $B_0 B_1 \ldots B_{N-1}$ do not identically match the corresponding TAG bits in the TAG table directory addressed by SET, line 27' is pulled low, indicating a MISS, in accordance with the truth table given in FIG. 3(b). Conversely, if all corresponding bits match, line 27' remains high indicating a HIT.

FIG. 5 shows a circuit for a preferred embodiment of a one-bit CAM storage and comparison cell 30' used in TAG directory 12. Flip-flop 21 is used to store bit $A_k$ using cross-coupled inverters. Writing to flip-flop 21 is accomplished by activating word-line 31, thereby causing transistors 32 and 33 to connect flip-flop 21 to bit-lines 22 and 22'. The desired state of the bit to be stored is applied to bit-line 22 and its complement to bit-line 22'. In this manner, flip-flop 21 is forced into the desired state. Deactivating word-line 31 leaves the flip-flop in a state representative of the bit applied to bit lines 22 and 22'.

When a TAG comparison is to be made, the appropriate bit, $B_k$, from the cache address word, TAG-field 11, is applied to bit-line 22 and its complement, $\bar{B}_k$, to line 22'. The state of $\bar{A}_k$ in flip-flop 21 and $B_k$ on line 22 is applied to AND-gate 25 comprising series connected transistors 34 and 35. The series connected transistors forms an AND-gate so that if $\bar{A}_k \cdot B_k$ is true, HIT/MISS line 27' is pulled low indicating a MISS ($A_k \neq B_k$), and if $\bar{A}_k \cdot B_k$ is false, the series connected transistors form an open circuit indicating a HIT and leaving MISS/HIT LINE 27' unaffected.

Similarly, bits $A_k$ and $\bar{B}_k$ are applied to AND-gate 26 comprising series connected transistors 36 and 37 so that if $A_k \cdot \bar{B}_k$ is true, MISS/HIT line 27' is pulled low, also indicating a MISS because $A_k \neq B_k$. In this manner, the state of MISS/HIT line 27' corresponds to the exclusive-NOR of bit $A_k$ and $B_k$, ($A_k \oplus B_k$).

The circuit of FIG. 5 may be used to form a multi-bit TAG comparator unit similar to that shown in FIG. 4, by commonly connecting MISS/HIT LINE 27' of individual one-bit CAM cells 30'. However, when the TAG has a large number of bits requiring the cascading of many one-bit CAM comparator 30 cells, heavy capacitive loading of the commonly connected MISS/HIT line 27' may result, causing the response-time of line 27' to significantly increase.

The prior art approach to minimizing the slow-down due to capacitive loading of MISS/HIT line 27' involves breaking-up the TAG bits into subgroups in order to keep the capacitive loading on the subgroup MISS/HIT line 27' at a tolerable level, buffering and detecting the state of each subgroup's MISS/HIT line 27', and then logically combining the HIT/MISS line 27', and state of each subgroup to obtain a complete HIT/MISS decision for the entire TAG field. This technique, known as a multiple-stage domino method, may be implemented as shown in FIG. 6, for example.

In the example of FIG. 6, the TAG field is broken-up into 4-bit subgroups 40, each subgroup comprising 4 one-bit CAM comparison units 30', each sharing a common MISS/HIT line 27', and a stage-1 domino network 41 that buffers MISS/HIT line 27' and outputs the MISS/HIT line state on line 42.

Each of the stage 1 domino network 41 outputs for a number of subgroup 40 units are combined into a second level by means of stage-2 domino circuit 43. The number of subgroups accommodated is determined by the fan-in capability of the particular stage-2 domino circuit. The buffered output of stage-2 domino circuit 43 represents the Boolean AND of all the inputs received from the associated subgroup 40 units.

Additional hierarchical domino levels may be accommodated by providing stage-3 domino circuit 44 to combine a number of additional stage-2 domino circuits and, possibly, a stage-4 domino circuit 45 for combining additional stage-3 domino circuits.

The number of hierarchical levels are determined by the fan-in capabilities of the various domino circuits to ensure acceptable speed of response for determining the state of the MISS/HIT indicator. However, as the size of the cache look-up table increases, the number of TAG-bits increase, and the number of domino circuit hierarchical levels increase causing a larger response time for each TAG MISS/HIT decision. A concomitant penalty of the multi-stage domino method is the larger on-chip area required to implement the cache table directory.

The disadvantages of the prior art multi-stage domino method may be overcome by using a single stage look-up table TAG comparator circuit 60, as shown in FIG. 7.

Unit 50 of FIG. 7 is a group of CAM comparison cells 30', all sharing a common MISS/HIT line 27'. Each CAM unit 30' is implemented as shown in FIG. 5. The output of unit 50, MISS/HIT line 27', is connected to small signal sense amplifier 52 where it is compared (differenced) with a stable precision reference voltage applied to line 51. Small signal sense amplifier 52 is a high gain differential amplifier and thresholding device that amplifies small differences between the MISS/HIT line voltage and the reference voltage which, when applied to the threshold device produces a two-state output signal indicative of the state of MISS/HIT line 27'.

FIG. 8 shows how the increase in speed of detection is achieved by the single stage look-up table TAG comparator of FIG. 7. The reference voltage, $V_R$, represents the high logic level. $V_H$ and $V_L$ represent the high logic state and low logic state thresholds, respectively so that all voltage levels above $V_H$ are classified as high-state and those below $V_L$ are classified as low-state signals. Signals with levels between $V_L$ and $V_H$ are indeterminate. The voltage level of MISS/HIT line 27' is a dynamic signal that is subject to high-to-low state transitions whenever a MISS is detected in one of the CAM comparator 30' units. In FIG. 8 such a transition is shown being initiated at time $t_0$. The rate at which this signal decreases toward the low state threshold level is a function of the number of CAM comparison cells 30' that share the common HIT/MISS line 27', the rate being slower as CAM cells 30' are added. In the example shown, $v_{27'}$ crosses the low logic state threshold at time $t_2$ so that the total time interval for detection is $\Delta t_2 = t_2 - t_0$ if normal logic level detection techniques are used. However, the use of small signal sense amplifier 52 with its high internal differential gain permits the early detection of the onset of the high-to-low transition by amplifying the difference $\Delta v = v_R - v_{27'}$ so that when the gain, K, of the differential amplifier is applied to $\Delta v$, a voltage level K·$\Delta v$ results that exceeds the high logic level threshold, $V_H$, at time $t_1$, a time significantly earlier than time $t_2$. The detection interval ($\Delta t_1 = t_1 - t_0$) is improved by a ratio of $\Delta t_2 / \Delta t_1$.

In this manner, the number of CAM comparison cells 30' that can be commonly OR-connected is significantly greater than the number of CAM comparison cells 30' that can be included in a subgroup 40 of the prior art multiple-stage domino method shown in FIG. 6.

FIG. 9 shows a complete TAG look-up table based on the single stage detection principle, as described above. Each unit 50 constitutes a complete CAM detection circuit for a single TAG entry by having one CAM cell 30' for each TAG bit. The complete TAG directory table 12 of FIG. 1 is made up of one unit 50 for each TAG entry. The output MISS/HIT line 27' of each unit 50 is connected to an input of MUX (selector) 53 which is controlled by the SET bit-field of the cache-line address word so that the proper unit 50 is selected as the CAM searches through TAG directory 12.

Because the time for determining a miss has been substantially reduced by using the single stage detection principle, the search through the look-up table can be made at a higher rate and thus significantly improve the effective bandwidth of a CAM.

FIG. 10(a) shows an implementation of small signal sense amplifier 52 in the form of a long-tail transistor pair (91 and 92) differential amplifier used to compare the signal on MISS/HIT line 27' with $V_{REF}$ on input line 51. Transistor 93 is the long-tail pair current source, controlled by the ENABLE signal on input line 97. Control signal, ENABLE, also controls the state of p-channel transistor switch 96 that connects the source terminals of transistors 91 and 92 when ENABLE is false (low), equalizing the voltages of the sources of transistors 91 and 92. P-channel transistors 94 and 95 act as active loads for transistors 91 and 92, respectively. The HIT output terminal 61 is connected through an inverting buffer to the source of transistor 91 while the MISS output is connected to through an inverting buffer to the source of transistor 92. When ENABLE is set high, transistor 93 is turned-on while transistor 96 is turned-off, allowing the source voltage of transistors 91 and 92 to vary. If MISS/HIT line 27' is high relative to $V_{REF}$, transistor 91 increases its conductance, causing more current to flow through transistor 91 than through transistor 92. This, in turn, causes the drain voltage of transistor 92 to increase while the voltage on the drain of transistor 91 decreases. The cross-coupling of the drains of p-channel transistor 94 and 95 causes the voltage drop across transistor 94 to increase, thus decreasing the source voltage of transistor 91. The inverting buffer output on output HIT line 61 consequently goes high indicating a hit conductor while MISS terminal 61' begins to swing low. Conversely, if a MISS condition is initiated on HIT/MISS line 27', the drain voltage of transistor 92 begins to swing low causing output MISS terminal 61' to begin to swing high indicating the onset of MISS condition. Thus, the cross-coupling of transitions 94 and 95 provide regenerative feedback within the differential amplifier that aids in the early detection and thresholder of the state of the MISS/HIT line.

FIG. 10(b) shows a schematic symbol for small signal sense amplifier 52.

FIG. 11(a) is a schematic for a small signal sense amplifier circuit 52 including auxiliary apparatus for initializing the detection of a hit or miss. As in FIG. 10(a), MISS/HIT line 27' from CAM comparator 30 units and $V_{REF}$ from reference generator 110 are connected to the input data terminals of small signal sense amplifier 52. Reference generator 110 includes transistors 104 and 105 with the gate of transistor 104 connected to the ENABLE line 97. Transistor 105, with its gate connected to its source terminal, causes transistor 105 to behave like a zener diode constant current source. Thus, when ENABLE is low, transistor 104 is non-conducting causing a constant current from transistor 105 to flow to capacitor C, connected to the $V_{REF}$ output line 51 of reference generator 110. If PRE-CHARGE# is set low, MISS/HIT line 27' and $V_{REF}$ line 51 are connected by the conducting state of transistor 103. Also, transistors 101 and 102 are also conducting causing lines 27' and 51 to rise to $V_{CC}$. If PRE-CHARGE# is set to high, and ENABLE is also set to high, MISS/HIT line 27' and $V_{REF}$ line 51 are made independent. Capacitor C begins to discharge through transistor 104, which is in a conducting state, causing the capacitor voltage to fall exponentially to $V_{CC}/2$, the voltage across transistor 104, as shown in FIG. 11(b). If the state of line 27' indicates a HIT, it remains at $V_{CC}$. However, if line 27' begins to drop from $V_{CC}$ indicating an onset of a MISS, the voltage drops towards $V_{SS}$ as indicated by the dotted-line labeled MISS. Capacitor C is chosen so that its discharge path time-constant causes it to approach $V_{CC}/2$ at twice the rate that line 27' is approaching $V_{SS}$, in the worst case condition when only one bit is a miss. Small signal sense amplifier 52 is able to distinguish between a hit condition causing a differential voltage of V at time $t_1$ after the start of the comparison. Similarly, if a MISS is initiated on line 27', a differential of at least V will be sensed at time $t_1$ indicating a MISS.

Another circuit arrangement for performing the early onset of a HIT or MISS is shown in FIGS. 12(a) and 12(b). In this case, reference generator 112 produces a stable output voltage of $V_{CC}/2$ on line 51 which is compared with the voltage level on line 27' by small signal sense amplifier 52. Solid state switch 107 is a transfer gate switch that is controlled by EQUAL line 108. It connects lines 27' and 51 in order to initialize the charge so that each line is at $V_{CC}/2$, as shown in FIG. 12(b) during the time interval before $t_0$. At time $T_0$, COMPARE line 109 is raised high causing transistor 106 to stop conducting and the comparison begins. If HIT/MISS line 27' represents a HIT, the voltage will begin rising towards $V_{CC}$ while $V_{REF}$ remains at $V_{CC}/2$. Conversely, the onset of a MISS will cause line 27' to fall towards $V_{SS}$ as indicated by the dotted-line labeled MISS. At a pre-set time interval, corresponding to time $t_1$. ENABLE is switched to high on line 97. The worst case MISS condition will produce a change of at least $\Delta V$ for a MISS and also a change of $\Delta V$ for a HIT, enabling small signal sense amplifier to make an early detection of the comparison result.

A fully associative CAM with a faster response time, but with greater complexity that results in greater chip area use, can be structured as shown in FIG. 13. Unit 62 is a CAM TAG directory made up of individual single stage look-up table TAG comparator circuits 60, each with output lines 61. Each output line 61 functions as a fully decoded line access control line for selecting access to a corresponding line of SRAM 13' that shows a hit.

FIG. 14 shows a direct mapped CAM employing a multiplexed input small signal sense amplifier 52 as shown in FIG. 9 in which the table address used to control selector 53 is also used as a line address for SRAM 13. The output of small signal sense amplifier 52 is used to enable access when its output indicates a hit.

FIG. 15 shows a set associative CAM used as a cache memory with M-ways. The CPU provided cache address word 18 contains a TAG field 11, SET field 17, and word and/or byte address field 19. The target TAG of TAG field 11 is applied to M-way TAG directory 80, more specifically to each of the M TAG tables 82. Each TAG table 82 is made up of N single stage TAG comparator circuits 60. Access to a specific line of TAG comparators 60 is made by the line address specified by SET field 17. Thus, a line of TAG comparator corresponds to a TAG subdirectory similar to the TAG directory 62 of the fully associative CAM of FIG. 13. The set of output lines 61 constitute a fully decoded set of control lines for controlling way selector 86. Cache RAM 81 comprises M-ways with N lines of data each, the content of each line addressed by SET field 17 sot hat corresponding lines of RAM 81 and TAG directory 80 are simultaneously selected. The contents of the selected line (line k in this example)is made available on output lines 87 to the input of way selector 86. Line k of a particular RAM way 83 is shown for output by way selector 86 by the fully decoded output lines 61 of TAG directory 80. The active line corresponding to a hit selects the corresponding way 83 of RAM 81.

FIG. 16 shows a sector mapped CAM used as a sector mapped cache comprising a TAG directory 62, a RAM 84 organized with M sectors (0, 1, ..., M−1) of N lines each. TAG field 11 of CPU cache address word 18 contains the target TAG that is applied to TAG directory 62 comprised of single stage TAG comparators 60 each with an output line 61. If a TAG hit is made, the corresponding output line 61 is activated and selects its corresponding sector of RAM 84. SET field 17 of CPU address word 18 then selects one-of-N lines in the selected sector for outputting.

What is claimed is:

1. A single stage sensing apparatus for use in a content addressable memory (CAM) by comparing a target TAG field from a CAM address word with a TAG entry stored in a CAM directory table, the single stage sensing apparatus comprising:
   (a) a TAG storage and comparator unit comprising a multiplicity of CAM cells, each CAM cell including,
      (i) a one-bit storage device for storing a bit of a TAG entry, and
      (ii) a comparator, coupled to the one-bit storage device and to a corresponding bit of the target TAG field, for producing a binary output signal in a first state indicating a hit if both bit states are the same, otherwise producing an output signal in a second state indicating a miss;
   (b) a multi-input OR-gate means with an input for accepting each CAM cell output signal and with an output for producing an output signal that represents a logical OR-ing of all CAM cell outputs so that if all CAM cell output signals indicate a hit, a first state signal is produced at the output and, if any CAM cell output signal indicates a miss, a second state signal is produced at the output; and
   (c) a small signal sense amplifier for anticipating a state change in the multi-input OR-gate means output signal by detecting an onset of a state change from the first state to the second state, the small signal sense amplifier including,
      (i) a differential amplifier with a first input coupled to the output signals of the combining logic network and a second input for coupling to a reference signal with a level corresponding to the combining logic network output signal first state, the differential amplifier for producing an output signal representative of an amplified difference between both input signals, and
      (ii) a thresholding network coupled to the differential amplifier output signal for producing a binary output signal in a first state if both differential amplifier input signals are essentially the same, otherwise outputting the binary signal in a second state if the differential amplifier first input begins to deviate from the reference signal level.

2. The single stage sensing apparatus of claim 1 wherein the multi-input OR-gate means comprises a common wire connected to each CAM cell output for producing a wired-OR output.

3. The single stage sensing apparatus of claim 2 wherein the CAM cell comparator comprises a logic network for performing a Boolean AND operation on the stored bit state and the logically complemented corresponding bit of the target TAG field for producing a first output signal, and for performing a Boolean AND operation on the logically complemented stored bit state and the corresponding bit of the target TAG field, either output signals producing a second state signal if true, each output signal wired-OR connected to the common wire in order to force the common wire state into the second state if either signal is true.

4. The single stage sensing apparatus of claim 1 wherein each CAM cell comparator is an exclusive-OR device producing a first state output signal if both bit states are the same, otherwise producing a second state output signal.

5. The single stage sensing apparatus of claim 1 wherein the CAM cell one-bit storage device is a flip-flop.

6. A fully associative content addressable memory (CAM) directory for determining if a specific set of data is stored in a random access memory (RAM) line, the specific set of data being identified by a field of bits, called a TAG, stored in a CAM directory look-up table in a look-up table location indicative of a location in RAM at which the specific set of data is stored, by addressing the look-up table using a target TAG to identify the specific set of data, a comparison is made with each TAG entry stored in the look-up table, and if a match (called a hit) is found, the location of the matching TAG entry in the look-up identifies the location in RAM, the CAM directory comprising a multiplicity of single stage sensing apparatuses, one for each line of RAM, each single stage sensing apparatus having means for accepting a target TAG field of bits, and producing at each single stage sensing apparatus output a binary control signal that indicates if a hit occurs, the set of output lines constituting a fully decoded set of select lines for selecting a RAM line for access to the specific set of data, and each single stage sensing apparatus comprising:

(a) a TAG storage and comparator unit comprising a multiplicity of CAM cells, each CAM cell including,
   (i) a one-bit storage device for storing a bit of a TAG entry, and
   (ii) a comparator, coupled to the one-bit storage device and to a corresponding bit of the target TAG field, for producing a binary output signal in a first state indicating a hit if both bit states are the same, otherwise producing an output signal in a second state indicating a miss;

(b) a combining logic network coupled to the output signal of each CAM cell for determining if all CAM cell output signals indicate a hit by outputting a binary output signal in a first state if true, otherwise outputting a signal in a second state;

(c) a small signal sense amplifier for anticipating a state change in the combining logic network output signal by detecting an onset of a state change from the first state to the second state, the small signal sense amplifier including,
   (i) a differential amplifier with a first input coupled to the output signals of the combining logic network and a second input for coupling to a reference signal with a level corresponding to the combining logic network output signal first state, the differential amplifier for producing an output signal representative of an amplified difference between both input signals, and
   (ii) a thresholding network coupled to the differential amplifier output signal for producing a binary output signal in a first state if both differential amplifier input signals are essentially the same, otherwise outputting the binary signal in a second state if the differential amplifier first input begins to deviate from the reference signal level.

7. A multiplexed content addressable memory (CAM) directory for determining if a specific set of data is stored in a random access memory (RAM), the specific set of data being identified by a field of bits called a TAG that is stored in a look-up table in a location indicative of a location in RAM at which the specific set of data is stored, by addressing the look-up table using a target TAG to identify the specific set of data, a comparison is made with each TAG entry stored in the look-up table and, if there is a match, called a hit, the location of the matching TAG entry in the look-up table identifies the location in RAM of the specific set data, the multiplexed CAM directory comprising:

(a) a set of look-up table TAG storage and comparator units, one for each RAM line, including,
   (i) a multiplicity of CAM cells, one for each TAG bit, each CAM cell having a one-bit memory for storing a TAG entry bit, means for accepting a corresponding target TAG bit, and means for outputting a hit signal if both bit states match, otherwise indicating a miss, and
   (ii) a combining means coupled to the output of each CAM cell for producing an output hit signal indicating a hit if all cell outputs indicate a hit, otherwise indicating a miss;

(b) a multiple input selector switch with each input connected to a distinct look-up table TAG storage and comparator unit output, and an externally controllable control line for selecting an input that is to be connected to the multiple input selector switch output; and (c) a small signal sense amplifier for anticipating a change in the combining means output signal state, including,
   (i) a differential amplifier with a first input connected to the multiple input selector switch output, a second input for connecting to an externally supplied reference signal with a level corresponding to a logic level representative of a hit, and an output representative of an amplified difference of the first and second input signals and indicative of an onset of a change of state of multiple input selector switch output, and
   (ii) a thresholding network connected to the output of the differential amplifier for producing an output logic signal indicative of a hit or miss.

8. A fully associative content addressable memory (CAM) capable of being accessed for a specific line of data stored in a random access memory (RAM), the specific line of data being identified by a field of bits, called a TAG, the TAG stored in a look-up table in a location indicative of a location in RAM at which the specific line of data is stored, by addressing the look-up table using a target TAG to identify a specific line of data that is to be accessed, a comparison is made with each TAG entry stored in the look-up table and the target TAG, and if a match, called a hit, is found, the location of the matching TAG entry in the look-up table identifies the location in RAM of the specific line of data, the fully associative CAM comprising:

(a) a CAM directory including a look-up table comprising a multiplicity of single stage sensing apparatuses, one for each line of RAM, a line corresponding to a specific set of data, each single stage sensing apparatus having means for storing a TAG, for accepting an externally provided target TAG, comparing the stored and target TAG, and producing at each single stage sensing apparatus output line a binary control signal indicating a hit if there is a match, otherwise indicating a miss, the set of single stage sensing apparatus output lines constituting a fully decoded set of select control lines for selecting a RAM line for access to the specific set of data, each single stage sensing apparatus including:

(i) a multiplicity of CAM cells, one for each TAG bit, each CAM cell having a one-bit memory for storing a TAG bit, means for accepting a corresponding target TAG bit, comparing the stored TAG bit and target TAG bit, and generating an output signal representative of the comparison outcome, (ii) a combining means coupled to the output of each CAM cell for producing an output signal indicating a hit if all CAM cell outputs indicate a hit, otherwise indicating a miss, and (iii) a small signal sense amplifier for anticipating a change in state of the combining means, including, a differential amplifier with a first input connected to the combining means output, a second input connected to an externally supplied reference signal with a level corresponding to a logic level indicative of a hit, and an output signal representative of an amplified difference between the first and second input signals, and a thresholding network with an input connected to the output signal of the differential amplifier, for producing an output logic level on an output line indicative of an anticipated hit, if a hit indication is to be made by the combining means, otherwise indicating an anticipated miss; and (b) a RAM, with line select inputs for accepting a fully decoded set of line select control lines, each line select control line input coupled to a corresponding single stage sensing apparatus output, for controlling access to a line in RAM that has a hit in the corresponding single stage sensing apparatus as indicated by an active line select control line.

9. A direct mapped content addressable memory (CAM), with a multiplexed CAM directory, capable of being accessed for a specific set of data stored in a random access memory (RAM), the specific set of data being identified by a field of bits, called a TAG, stored at an address in a look-up table specified by an externally supplied address specifying a location indicative of a location in RAM at which the specific set of data may be stored, by addressing the look-up table by the externally supplied address, and by using a target TAG to identify the specific set of data, a comparison is made with each TAG entry stored in the look-up table and if a match, called a hit, is found at the externally supplied address, the location of the matching TAG entry in the look-up table identifies the location of the desired data in RAM, the CAM comprising:

(a) a multiplexed CAM directory including, (i) a look-up table having a set of look-up table units, one for each RAM line, each look-up table unit including, a multiplicity of CAM cells, one for each TAG bit, each CAM cell having a one-bit memory for storing a TAG entry bit, means for accepting a corresponding target TAG bit, and means for outputting a hit signal if both bit states match, otherwise outputting a miss signal, and a combining means coupled to the output of each CAM cell for producing an output signal indicating a hit if all CAM cell outputs indicate a hit, otherwise indicating a miss;

(ii) a multiple input selector switch with each input connected to a distinct look-up table unit output, an externally controllable control line for selecting an input that is to be connected to the selector switch output, and (iii) a small signal sense amplifier for anticipating a change in state of the combining means output signal, including, a differential amplifier with a first input connected to the multi-input selector switch output, a second input for connecting to an externally supplied reference signal with a level corresponding to a logic level representative of a hit, and an output signal representative of an amplified difference between the first and second input signals, and a thresholding network with an output connected to the output signal of the differential amplifier and producing an output logic signal indicative of a hit or miss;

(b) a RAM including an access enable control means coupled to the output of the CAM directory small signal sense amplifier for enabling access to the RAM if the small signal sense amplifier output indicates a hit, the RAM having means for accessing by a coded address, the coded address also used by the multiple-input selector switch control line signal for selecting a RAM line corresponding to the address of a CAM directory hit.

10. A set associative content addressable memory (CAM) capable of being accessed for a specific line of data stored in a random access memory (RAM), the RAM organized to have at least two ways, each way being addressable simultaneously by a common line address index, the specific line of data further selected by use of a field of bits called a TAG, a set of TAG entries stored in a TAG directory having a set of distinct TAG look-up tables, one for each way, and a TAG entry in each look-up table for each RAM line address index so that a TAG entry located at a particular look-up table and located at a particular line index is indicative of a line of data located at a specific corresponding way and line address index, the set associative CAM comprising:

(a) a RAM having at least two ways, each way line contents simultaneously accessed by means of an externally supplied line address index, each way having an output means for outputting the way line contents accessed by the address index;

(b) a TAG directory having a set of look-up tables with a distinct look-up associated with each way, each look-up table including a multiplicity of single stage sensing apparatuses, one for each corresponding line address index, each single stage sensing apparatus having means for selectively accepting an externally supplied target TAG for comparison with a stored TAG entry and outputting a binary control signal indicating a hit if there is a match, otherwise indicating a miss, a specific single stage sensing apparatus of each look-up table is simultaneously selected by the externally supplied common address index, each single stage sensing apparatus includes, (i) a multiplicity of CAM cells, one for each TAG bit, each CAM cell having a one-bit memory for storing a TAG bit, means for accepting a corresponding target TAG bit, comparing the stored TAG bit and target TAG bit, and generating an output signal representative of the comparison outcome, (ii) a combining means coupled to the output of each CAM cell for producing an output signal indicating a hit if all CAM cell outputs indicate a hit, otherwise indicating a miss, and (iii) a small signal sense amplifier for anticipating a change in state of the combining means, including, a differential amplifier with a first input connected to the combining means output, a second input connected to an externally supplied reference signal with a level corresponding to a logic level indicative of a hit, and an output signal representative of an amplified difference between the first and second input signals, and a thresholding network with an input connected to the output signal of the differential amplifier, for producing an output logic level on an output line indicative of an anticipated hit, if a hit indication is to be made by the combining means, otherwise indicating an anticipated miss;

(c) a way selector, controlled by a fully decoded set of lines, the decoded set of lines corresponding to the set of selected small signal sense amplifiers output lines, one from each look-up table, the way selector having a set of inputs for accepting the accessed line data output of each way, and an output for delivering the accessed line data of the way selected by the fully decoded set of lines, the way selector output corresponding to the look-up table TAG matching the target TAG and corresponding to the location in look-up table specified by the line index.

11. A sector mapped content addressable memory (CAM) capable of being accessed for a specific line of data stored in a random access memory (RAM) the RAM organized into a multiplicity of sectors, each sector containing a number of sequentially ordered lines of data located in accordance with a line index, the specific line of data being identified by a field of bits, called a TAG, and the line index, access to RAM being obtained by comparing a target TAG corresponding to the specific line of data with a sector TAG entry, stored in a CAM directory, and if a match, called a hit, is found, the specific line of data is accessed at a RAM sector corresponding to the sector TAG entry and at a location within the RAM sector corresponding to the line index, the CAM comprising:

(a) a RAM having a multiplicity of sectors for storing lines of data, each sector having a number of lines, each line ordered in accordance with a line index; and (b) a CAM directory having a multiplicity of single stage sensing apparatuses, one for each sector of RAM, each single stage sensing apparatus having means for accepting a target TAG, comparing the target TAG with a stored TAG, each stored TAG associated with a particular RAM sector, and producing at each signal stage sensing apparatus output a binary single indicating if a match, called a hit, exists between the target and stored TAG, otherwise indicating a miss, if a hit exists, the corresponding sector of RAM is enabled, each single stage sensing apparatus including, (i) a multiplicity of CAM cells, one for each TAG bit, each CAM cell having a one-bit memory for storing a TAG bit, means for accepting a corresponding target TAG bit, comparing the stored TAG bit and target TAG bit, and generating an output binary signal representative of the comparison outcome, (ii) a combining means coupled to the output of each CAM cell for producing a binary output signal indicating a hit if all CAM cell outputs indicate a hit, otherwise indicating a miss, (iii) a small signal sense amplifier for anticipating a change of state of the combining means, including, a differential amplifier with a first input connected to the combining means output, a second input connected to a reference signal with a level corresponding to a logic level indicative of a hit, and an output signal representative of an amplified difference between the first and second input signals, and a thresholding network with an input connected to the output signal of the differential amplifier, for producing an output logic level, on an output line, indicative of an anticipated hit, if a hit is to be made, otherwise indicating a miss.

* * * * *

UNITED STATES PATENT AND TRADEMARK OFFICE
CERTIFICATE OF CORRECTION

| | | |
|---|---|---|
| PATENT NO. | : | 5,428,565 |
| DATED | : | June 27, 1995 |
| INVENTOR(S) | : | Jeng-Jye Shaw |

It is certified that error appears in the above-identified patent and that said Letters Patent is hereby corrected as shown below:

In column 2 at lines 67-68 delete "symbolic schematic" and insert -- schematic symbol--

In column 5 at line 10 delete "$B_k+A_k$" and insert --$\overline{B}_k+\overline{A}_k$--

In column 5 at line 26 delete "$A_k \oplus B_k$" and insert --$\overline{A_k \oplus B_k}$--

In column 5 at line 26 delete "$+A_k \bullet B_k$" and insert --$+\overline{A}_k \bullet \overline{B}_k$--

In column 5 at line 42 delete "$A_k \oplus B_k$" and insert --$\overline{A_k \oplus B_k}$--

In column 6 at line 9 delete "$(A_k \oplus B_k)$" and insert --$(\overline{A_k \oplus B_k})$--

Signed and Sealed this

Twenty-ninth Day of October 1996

Attest:

BRUCE LEHMAN

Attesting Officer　　　Commissioner of Patents and Trademarks